United States Patent
Den Boef et al.

(10) Patent No.: US 11,815,675 B2
(45) Date of Patent: Nov. 14, 2023

(54) METROLOGY DEVICE AND PHASE MODULATOR APPARATUS THEREFOR COMPRISING A FIRST MOVING GRATING AND A FIRST COMPENSATORY GRATING ELEMENT

(71) Applicant: ASML Netherlands B.V., Veldhoven (NL)

(72) Inventors: Arie Jeffrey Den Boef, Waalre (NL); Simon Reinald Huisman, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 82 days.

(21) Appl. No.: 17/633,882

(22) PCT Filed: Jul. 27, 2020

(86) PCT No.: PCT/EP2020/071083
§ 371 (c)(1),
(2) Date: Feb. 8, 2022

(87) PCT Pub. No.: WO2021/028202
PCT Pub. Date: Feb. 18, 2021

(65) Prior Publication Data
US 2022/0299751 A1 Sep. 22, 2022

Related U.S. Application Data (60) Provisional application No. 62/884,702, filed on Aug. 9, 2019.

(30) Foreign Application Priority Data

Sep. 17, 2019 (EP) ..................................... 19197783
Jan. 15, 2020 (EP) ..................................... 20152053

(51) Int. Cl.
*G02B 26/06* (2006.01)
*G02F 1/11* (2006.01)
*G03F 9/00* (2006.01)

(52) U.S. Cl.
CPC .............. *G02B 26/06* (2013.01); *G02F 1/113* (2013.01); *G03F 9/7088* (2013.01)

(58) Field of Classification Search
CPC .......... G02B 26/06; G02B 26/00; G02F 1/11; G02F 1/01; G03F 9/70; G03F 7/00; G03F 7/70
(Continued)

(56) References Cited

U.S. PATENT DOCUMENTS 5,171,999 A 12/1992 Komatsu et al.
5,559,598 A 9/1996 Matsumoto
(Continued)

FOREIGN PATENT DOCUMENTS

CN 1967316 A 5/2007
CN 110095880 A 8/2019
(Continued)

OTHER PUBLICATIONS

Antoine Monmayrant et al., "PhD Tutorial; A newcomer's guide to ultrashort pulse shaping and characterization," Journal of Physics B, Atomic Molecular and Optical Physics, Institute of Physics Publishing, Bristol, GB, vol. 43, No. 10, May 28, 2010 (May 28, 2010), p. 103001, XP020173516, ISSN: 0953-4075.
(Continued)

*Primary Examiner* — Que Tan Le
(74) *Attorney, Agent, or Firm* — Sterne, Kessler, Goldstein & Fox P.L.L.C.

(57) ABSTRACT

Disclosed is a phase modulator apparatus comprises at least a first phase modulator for modulating input radiation, and a metrology device comprising such a phase modulator apparatus. The first phase modulator comprises a first mov-
(Continued)

ing grating in at least an operational state for diffracting the input radiation and Doppler shifting the frequency of the diffracted radiation; and a first compensatory grating element comprising a pitch configured to compensate for wavelength dependent dispersion of at least one diffraction order of said diffracted radiation.

15 Claims, 8 Drawing Sheets

(58) Field of Classification Search
USPC .............................. 250/221, 226, 216, 559.4
See application file for complete search history.

(56) References Cited

U.S. PATENT DOCUMENTS

| 5,946,128 | A | 8/1999 | Paek |
| 6,288,831 | B1 | 9/2001 | Iizuka |
| 6,297,876 | B1 | 10/2001 | Bornebroek |
| 6,628,406 | B1 | 9/2003 | Kreuzer |
| 6,961,116 | B2 | 11/2005 | Den Boef et al. |
| 7,511,799 | B2 | 3/2009 | Tel et al. |
| 8,208,121 | B2 | 6/2012 | Bijnen et al. |
| 9,970,747 | B2 | 5/2018 | Kreuzer et al. |
| 10,317,808 | B2 * | 6/2019 | Huisman ............ G01B 9/02097 |
| 10,422,508 | B2 | 9/2019 | Hill et al. |
| 10,585,363 | B2 | 3/2020 | Mathijssen et al. |
| 2004/0101237 | A1 | 5/2004 | Cao |
| 2005/0078296 | A1 | 4/2005 | Bonnet |
| 2008/0043212 | A1 | 2/2008 | Shibazaki |
| 2009/0051899 | A1 | 2/2009 | Harlander et al. |
| 2012/0200838 | A1 | 8/2012 | De Winter et al. |
| 2012/0262612 | A1 | 10/2012 | Zou et al. |
| 2015/0083698 | A1 | 3/2015 | Hua et al. |
| 2017/0160075 | A1 | 6/2017 | Kreuzer et al. |
| 2017/0350575 | A1 | 12/2017 | Hill et al. |
| 2018/0149987 | A1 | 5/2018 | Mathijssen et al. |
| 2018/0341105 | A1 | 11/2018 | Sobolev |
| 2019/0049866 | A1 | 2/2019 | Huisman et al. |
| 2019/0212658 | A1 | 7/2019 | Huisman et al. |
| 2022/0397833 | A1 | 12/2022 | Bijnen et al. |

FOREIGN PATENT DOCUMENTS

| EP | 0823667 | A2 | 2/1998 |
| JP | H01-145621 | A | 6/1989 |
| JP | H05-203412 | A | 8/1993 |
| JP | H06-082215 | A | 3/1994 |
| JP | H07-161611 | A | 6/1995 |
| JP | H07-208923 | A | 8/1995 |
| JP | H08-5329 | A | 1/1996 |
| JP | 2001-013474 | A | 1/2001 |
| JP | 2002-372407 | A | 12/2002 |
| JP | 2018-517933 | A | 7/2018 |
| JP | 2019-516126 | A | 6/2019 |
| TW | 201820057 | A | 6/2018 |
| WO | WO 02/06899 | A2 | 1/2002 |
| WO | WO 2017/125352 | | 7/2017 |
| WO | WO 2021/028292 | A1 | 2/2021 |

OTHER PUBLICATIONS

Dossou, "Doppler shift generated by a moving diffraction grating under incidence by polychromatic diffuse light," Centre for Ultrahigh-Bandwidth Devices for Optical Systems (CUDOS) and School of Mathematical and Physical Sciences, University of Technology, Sydney, PO Box 123, Broadway, New South Wales 2007, Australia.
Guangya Zhou et al., "MEMS gratings for nondispersive optical phase modulation," IEEE 21st International Conference on Micro Electro Mechanical Systems, 2008: MEMS 2008; Jan. 13-17, 2008, Tucson, Arizona, USA, Piscataway, NJ : IEEE Operations Center, Jan. 1, 2008 (Jan. 1, 2008), pp. 136-139, XP031210701, DOI: 10.1109/MEMSYS.2008.4443611, ISBN: 978-1-4244-1792-6.
International Search Report and Written Opinion of the International Searching Authority directed to related International Patent Application No. PCT/EP2020/072054, dated Dec. 11, 2020; 11 pages.
International Preliminary Report on Patentability directed to related International Patent Application No. PCT/EP2020/072054, dated Feb. 8, 2022; 8 pages.
International Search Report and Written Opinion of the International Searching Authority directed to related International Patent Application No. PCT/EP2020/071083, dated Oct. 19, 2020; 10 pages.
International Preliminary Report on Patentability directed to related International Patent Application No. PCT/EP2020/071083, dated Feb. 8, 2022; 7 pages.
Martin Eckstein et al., "Alignment and characterization of the two-stage time delay compensating XUV monochromator," arxiv .org, Cornell University Library, 201, Olin Library Cornell University, Ihaca, NY, 14853, Apr. 10, 2016 (Apr. 10, 2016), XP080694437.
Matthias Hofer et al., "Manipulating the transmission matrix of scattering media for nonlinear imaging beyond the memory effect," Optics Letters, Jan. 1, 2019 (Jan. 1, 2019), p. 2137, XP55734293, DOI: 10.1364/ao.XX.XXXXXX, Retrieved from the Internet: URL:https://opus.lib.uts.edu.au/bitstream/10453/47675/1/Dossou_AO_2016_preprint.pdf.
Roth et al., "Acousto-optical shaping of ultraviolet femtosecond pulses," Applied Physics B, vol. 80, Mar. 7, 2005; 4 pages.

* cited by examiner

METROLOGY DEVICE AND PHASE MODULATOR APPARATUS THEREFOR COMPRISING A FIRST MOVING GRATING AND A FIRST COMPENSATORY GRATING ELEMENT

CROSS-REFERENCE TO RELATED APPLICATIONS

This application claims priority of (1) U.S. Provisional Application No. 62/884,702, which was filed on Aug. 9, 2019; (2) EP Application Number 19197783.4, which was filed on Sep. 17, 2019; and (3) EP Application Number 20152053.3, which was filed on Jan. 15, 2020. These priority applications are incorporated herein in their entirety by reference.

FIELD

The present invention relates to methods and apparatus for applying patterns to a substrate in a lithographic process. The invention particularly relates to a metrology device such as an alignment sensor and a phase modulation apparatus for such a metrology device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error. Accordingly, there is a need for a system and method to provide alignment with high accuracy and less variation.

SUMMARY OF THE INVENTION

In a first aspect of the invention, there is provided a phase modulator apparatus for modulating input radiation; comprising: at least a first phase modulator comprising: a first moving grating in at least an operational state for diffracting the input radiation and Doppler shifting the frequency of the diffracted radiation; and a first compensatory grating element comprising a pitch configured to compensate for wavelength dependent dispersion of at least one diffraction order of said diffracted radiation.

A second aspect of the invention comprises a metrology device comprising a phase modulator apparatus of the first aspect.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
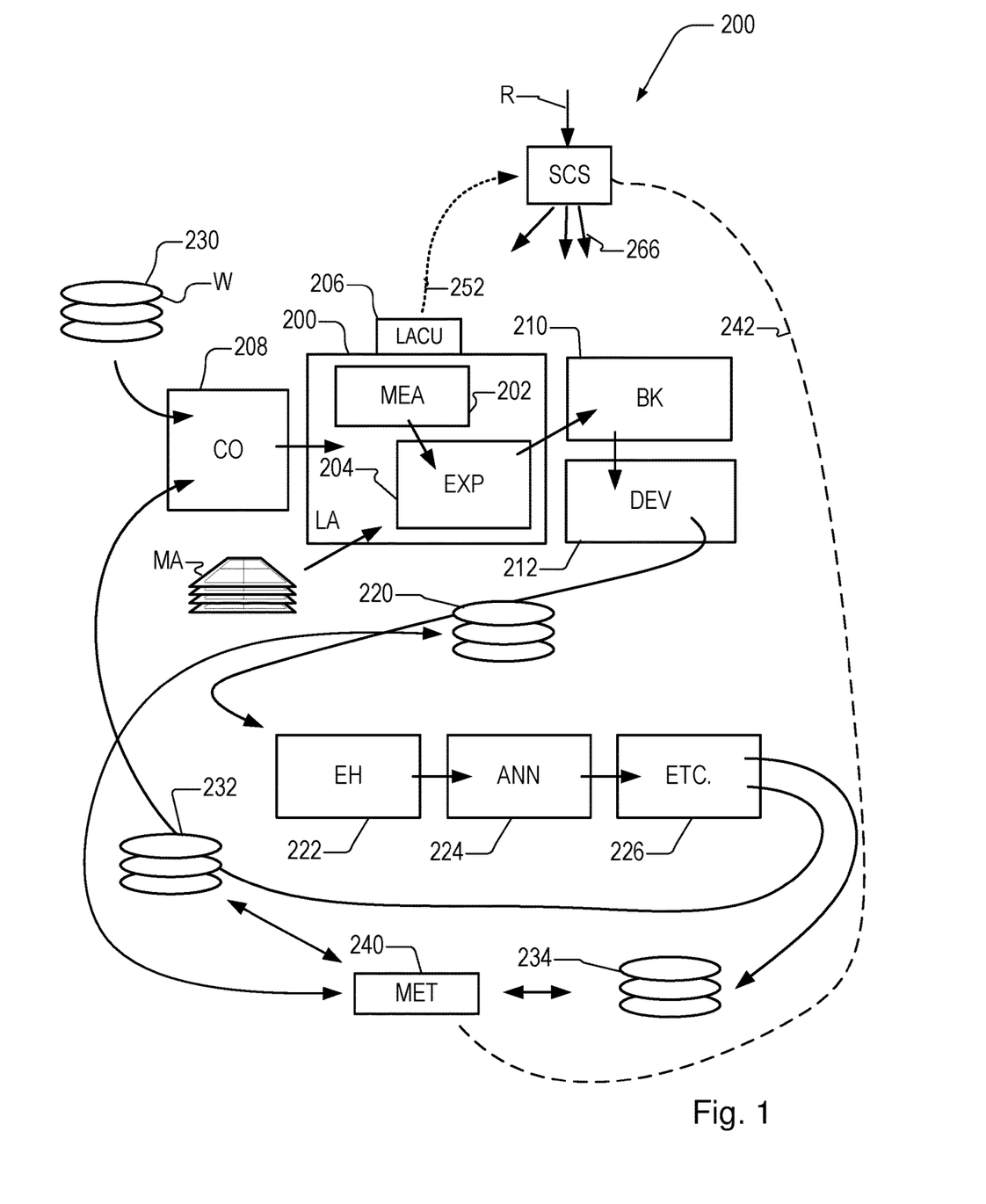
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figure 2:
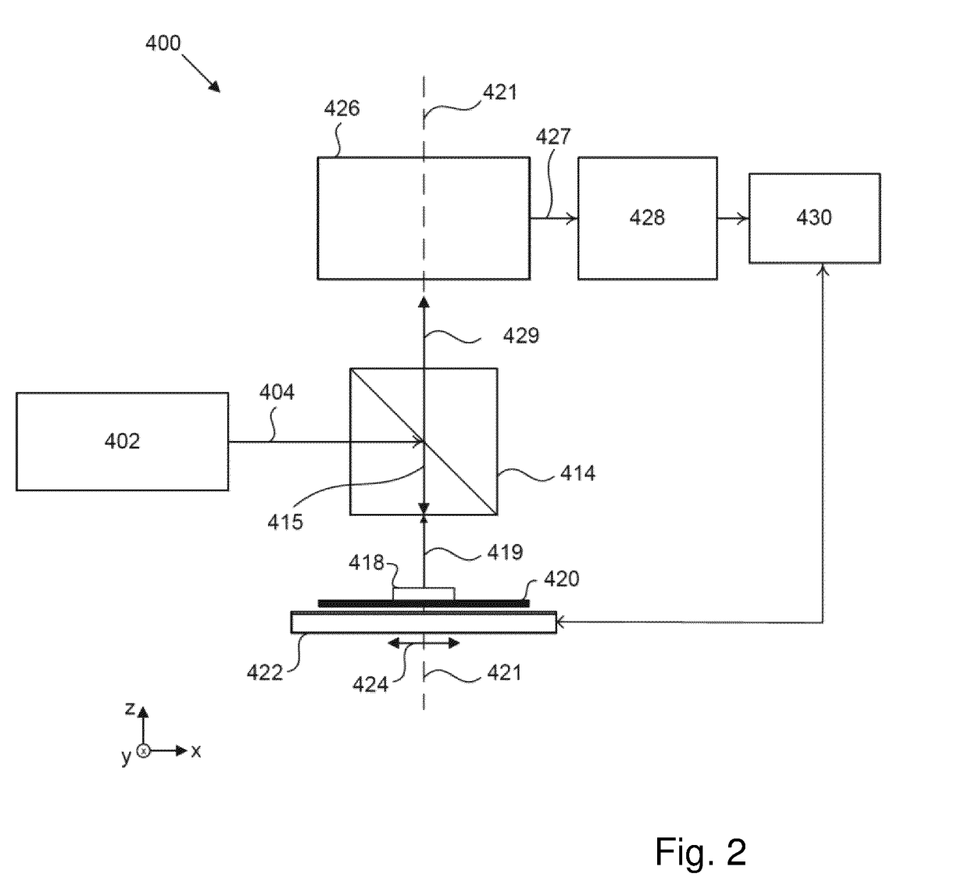
FIG. 2 is a schematic illustration of an alignment apparatus, according to an exemplary embodiment.

FIG. 2 illustrates a schematic of a cross-sectional view of an alignment apparatus 400 that can be implemented as a part of lithographic apparatus 100 or 100', according to an embodiment. In an example of this embodiment, alignment apparatus 400 may be configured to align a substrate (e.g., substrate W) with respect to a patterning device (e.g., patterning device MA). Alignment apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate According to an embodiment, alignment apparatus 400 may include an illumination system 402, a beam splitter 414, an interferometer 426, a detector 428, and a signal analyzer 430, according to an example of this embodiment. Illumination system 402 may be configured to provide an electromagnetic narrow band radiation beam 404 having one or more passbands. In an example, the one or more passbands may be within a spectrum of wavelengths between about 400 nm to about 2.0 µm. In another example, the one or more passbands may be discrete narrow passbands within a spectrum of wavelengths between about 400 nm to about 2.0 µm.

Beam splitter 414 may be configured to receive radiation beam 404 and direct a radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film in an example of this embodiment. In another example, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate.

Beam splitter 414 may be further configured to receive diffraction radiation beam 419 and direct diffracted radiation sub-beam 429 towards interferometer 426, according to an embodiment In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. Interferometer 426 may be further configured to rotate one of the two images with respect to the other of the two images 180° and recombine the rotated and unrotated images interferometrically. In some embodiments, the interferometer 426 can be a self-referencing interferometer, which is disclosed in U.S. Pat. No. 6,628,406 (Kreuzer) and is incorporated by reference herein in its entirety.

In an embodiment, detector 428 may be configured to receive the recombined image via interferometer signal 427 and detect interference as a result of the recombined image when an alignment axis 421 of alignment apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:
  measuring position variations for various wavelengths (position shift between colors);
  measuring position variations for various orders (position shift between diffraction orders); and
  measuring position variations for various polarizations (position shift between polarizations)

This data can for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or ATHENA (Advanced Technology using High order ENhancement of Alignment), as described in U.S. Pat. No. 6,297,876, which directs each of seven diffraction orders to a dedicated detector, which are both incorporated by reference herein in their entireties. Another alignment sensor for which the concepts described herein may be suitable is the laser interferometric alignment (LIA) sensor from the Nikon Corporation and/or their alignment system described in US 2008/0043212, which is incorporated herein by reference In an embodiment, signal analyzer 430 may be configured to determine a position of stage 422 and correlate the position of stage 422 with the position of the center of symmetry of alignment mark or target 418. As such, the position of alignment mark or target 418 and, consequently, the position of substrate 420 may be accurately known with reference to stage 422.

In some embodiments, detector 428 can be an array of detectors, allowing the possibility of accurate stack profile detection. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be readout at high speed and are especially of interest if phase-stepping detection is used.

Figure 3A:
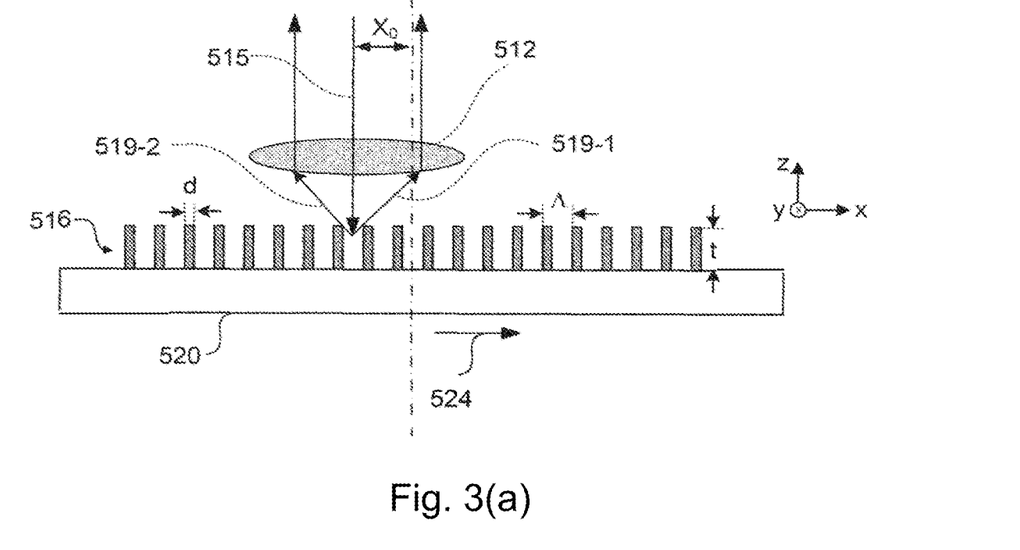
FIGS. 3(a) and 3(b) illustrate exemplary alignment targets designed with diffraction gratings, according to some embodiments of present disclosure.

FIG. 3(a) shows a cross-sectional view of a diffraction grating 516, according to an embodiment. Diffraction grating 516 can include a pitch or period of "Λ" and a grating line width of "d", formed on a substrate 520. The efficiency of high diffraction orders can be determined by parameters of diffraction grating 516, such as profile of the grating structure (e.g., rectangular shape), film stack thickness "t", duty cycle "F", etc. Duty cycle "F" can be defined as a ratio of grating width d and pitch Λ, i.e., F=d/Λ. Diffraction efficiency can be predicted using rigorous vector wave modeling or various other methods to solve Maxwell's equations which fully describe the electromagnetic fields as light propagates. In one example, the spectral property (e.g., diffraction angles) of diffraction grating 516 can be described by a grating equation. For example, at normal incidence with a radiation beam 515 having a wavelength of λ, diffraction angle $\vartheta_m$ of mth order can be predicted by:

$$\Lambda \sin(\vartheta_m) = m\lambda \quad (1)$$

and with an incident angle at $\vartheta_0$, diffraction equation (1) can be modified as $$\Lambda(\sin(\vartheta_m) - \sin(\vartheta_0)) = m\lambda \quad (2)$$

Diffraction gratings can be used as alignment marks (also referred to as alignment targets). The operation of an alignment system can be based on the phase shift Δφ between the two symmetric high order diffractions, for example, between diffraction beams 519-1 and 519-2 with m=+1 and m=−1, respectively. When diffraction grating 516 is not moving, frequency ν of diffraction beams 519-1 and 519-2 can be the same, e.g., νλ=c, wherein c is the speed of light. In this example, diffraction beams 519-1 and 519-2 are in phase. If diffraction grating 516 or substrate 520 is moving, for example, along a scanning direction 524 relative to an objective lens 512 or an interferometer (not shown) with a speed $V_{stage}$, the frequency of diffraction beam 519-1 can be increased by Δν, while the frequency of diffraction beam 519-2 can be decreased by Δν due to Doppler Effect. The resultant frequency difference results in a phase difference Δφ(t) between the diffraction beams 519-1 and 519-2 which arrive at the interferometer, which can be expressed as:

$$\Delta\varphi(t) = 2\pi(2\Delta\nu)t = 4\pi\frac{V_{stage}}{\Lambda}t \quad (3)$$

The other higher order diffraction beams follow similar behaviour. As such, the light intensity $I_{SUM}$ measured at the output of the interferometer can be a function of a grating offset $x_0$, a shift from a center of the grating.

$$I_{SUM} = I_0 + I_1\cos\left(\frac{4\pi x_0}{\Lambda} + \Delta\varphi(t)\right) \quad (4)$$

Figure 3B:
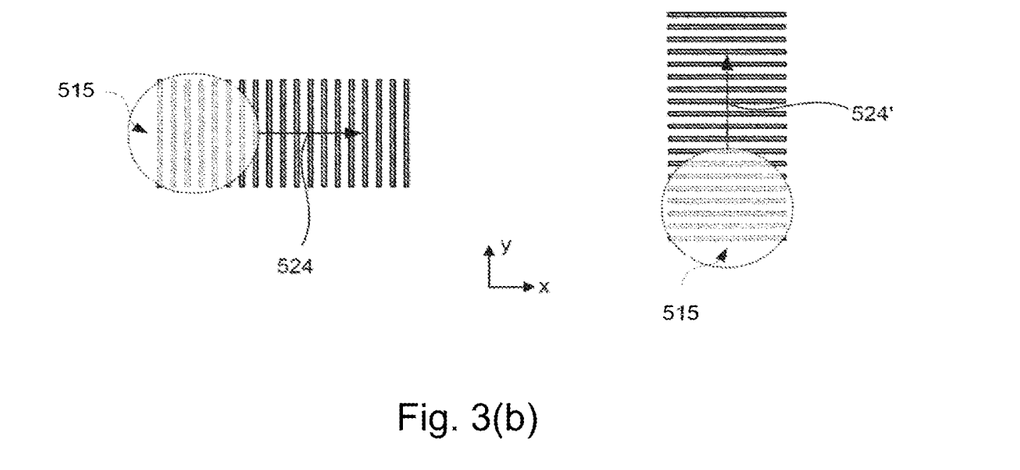

By scanning the grating 516 (shown in top-down view of FIG. 3(b)), alignment signal can be modulated and presented in the temporal modulation of the light intensity $I_{SUM}$. Through data processing and analysis, noises and other factors can be filtered out and grating offset $x_0$ can be determined by parameter fitting and extraction from the measured light intensity $I_{SUM}$. In FIG. 3(b), diffraction grating 516 is oriented either in x or in y direction on the substrate 520. In some embodiments, diffraction grating 516 can be oriented in any other directions on the substrate 520.

For example, diffraction grating 516 can have a 45 degree angle with respect to the x-direction (not shown in FIG. 3(b)).

Even as lithography systems provide smaller and smaller patterning features at advanced technology nodes for integrated circuits, they also need to increase accurate alignment between different lithography levels receiving smaller and smaller alignment marks or targets. Alignment marks can usually be placed in a scribe lane, an area between chips or dies (product areas) that is subsequently thrown away at die dicing before packaging. For a given process monitoring area, smaller size also allows more alignment marks being distributed at various locations to improve alignment and/or overlay uniformity across the wafer. Alternatively, for a die with large area, smaller alignment marks can be placed inside a die to improve alignment across a product chip.

Currently an interference-based alignment system relies on grating scanning to generate modulated alignment signals. FIG. 3(b) shows alignment marks along x and y directions on the substrate 520, according to some embodiments. The radiation beam 515 can scan across the alignment marks in x-direction and in y-direction. In some embodiments, substrate 520 moves instead of radiation beam 515.

In one example, in order to generate reliable alignment signals, long alignment marks are designed to provide enough distance for the scanning. In an image-based alignment system, small alignment marks can be used. However, resolution and speed may be limited due to large data acquisition and processing.

Figure 4:
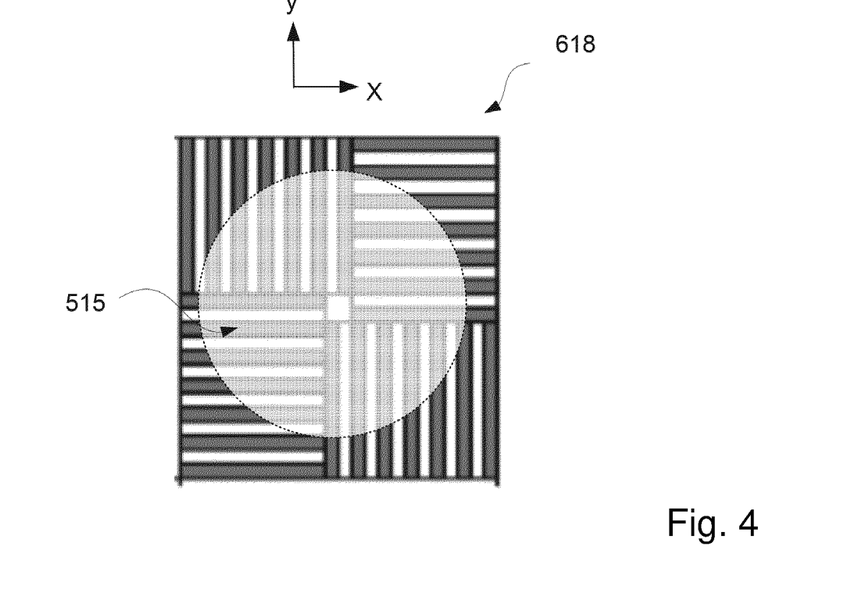
FIG. 4 illustrates an exemplary alignment target designed with two dimensional diffraction gratings, according to some embodiments of present disclosure.

Various embodiments in accordance with the present disclosure provide apparatus and methods for alignment with small marks by using active phase modulation. For example, alignment marks less than 6 μm in the x and y dimensions; e.g., as small as 5 μm×5 μm can be sufficient to provide alignment signals with good resolution. A top-down view of an exemplary alignment mark or target 618 is illustrated in FIG. 4, where two-dimensional diffraction gratings are arranged in x- and y-directions such that position of the alignment target 618 can be determined without moving radiation beam 515. By using active phase modulation, the alignment signals along x- and y-directions of the alignment target 618 can be measured simultaneously and position of the alignment target 618 in x- and y-directions can be determined simultaneously.

In some embodiments, alignment target 618 can include diffraction gratings oriented in any directions other than x- or y-directions. For example, the diffraction gratings can form a 45 degree angle with respective to x- or y-directions.

Various phase modulators have been proposed to achieve this phase modulation for alignment applications (or any other metrology applications which use heterodyne detection). Piezo modulators (e.g. a scanning mirror) have been proposed; however this means that phase modulation is determined by the movement of the mirror and the wavelength that is used which requires calibration. Using an electro-optical modulator means that the phase modulation depends on the wavelength that is used. Acousto-optical modulators provide a linear phase sweep which is wavelength independent, but each wavelength has a different output angle. This can lead to position errors within a single color band, if not calibrated correctly.

A phase modulator design is proposed herein which provides constant phase sweep and common output angle for all wavelengths. In addition, embodiments disclosed herein provide the constant phase sweep at a frequency which can be detected by low noise detectors such as those used presently on many alignment sensors.

Figure 5:
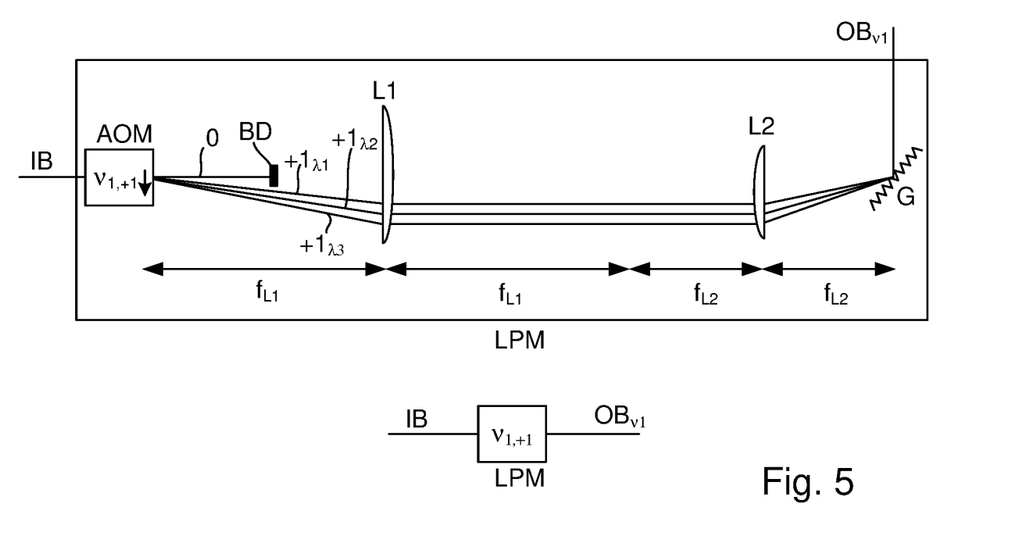
FIG. 5 is a schematic illustration of a linear phase modulator according to a first embodiment of the invention.

FIG. 5 illustrates the proposed linear phase modulator LPM according to a first embodiment. The phase modulation scheme is based on an acousto-optical filter, such as an acousto-optical modulator AOM (e.g., an acousto-optical tunable filter (AOTF)). The piezo-electric transducer of an AOM can be driven with a very stable frequency resulting in a very stable moving acoustic wave within the AOM medium (e.g., which may be quartz or any other suitable acousto-optic material). The tunability of an AOM enables tuning the diffraction angle of diffraction orders therefrom; e.g., to optimize a diffraction order.

In FIG. 5, an input beam IB is modulated using the acousto-optical modulator AOM, which is configured to provide an acoustic wave within the AOM medium having a frequency $\upsilon_1$. This traveling wave forms a moving acoustic grating, from which incident light (the input beam IB) diffracts. Since it is a moving grating, each diffracted order gets a Doppler shift $\Delta\upsilon_1$ of:

$$\Delta\upsilon_1 = n^*\upsilon_1 \qquad (5)$$

where n is the transmitted diffraction order. This Doppler shift is equivalent to a linear phase sweep for each wavelength comprised within the input beam IB, this phase sweep (temporal phase shift φ(t)) being described by the function:

$$\varphi(t) = 2^*\pi^*\Delta\upsilon_1^*t \qquad (6)$$

where t is time.

The AOM may be excited at frequencies in the order of MHz with e.g., a crystal oscillator (which is extremely stable). This results in only a few diffraction orders, which can be easily spatially separated, and blocked as required. For example, the zeroth order 0 may be blocked with a zeroth order stop or beam dump BD, and an equivalent beam dump may be used to block any other order as desired. The diffraction angle imposed by the AOM for a given order can be tuned; e.g., to maximize the amount of light in a desired diffracted order. For example, a practical embodiment may be configured to have about 50% of the incident light in the desired diffraction order, and the remainder in neighbouring orders. For simplicity only the zeroth order 0 and a first diffraction order (e.g., the +1 diffraction order) is shown in FIG. 5.

An advantage of an acousto-optical modulator AOM is that all wavelengths receive the same linear phase sweep. However, each wavelength (three wavelengths of one diffraction order $+1_{\lambda,1}, +1_{\lambda,2}, +1_{\lambda,3}$ are shown in the drawing) has a different propagation direction. This is not only a problem for multicolor applications, but also for single color applications in alignment and overlay. Typically in the latter case, there may be a color bandwidth of >5 nm, which means that each wavelength within this bandwidth will receive a different propagation direction, potentially leading to errors if left uncalibrated.

The solution proposed here is to refocus the output of the AOM on a grating G comprising a pitch which is matched to the acoustic grating of the AOM, including if necessary a correction for any magnification optics in between; e.g., resulting from the optical arrangement signified by lenses L1, L2. For simplicity, this optical arrangement has been illustrated as a 4f scheme (two lenses L1, L2 having focal lengths $f_{L1}, f_{L2}$ respectively); of course, this is purely exemplary and there are many alternative arrangements possible to refocus a beam using lenses, mirrors and/or other optical elements, etc. which could be used instead.

As already stated, in an embodiment, the AOM may be driven with MHz magnitude frequencies. This is because such frequencies result in acoustic gratings with nominal pitches in a desirable range (e.g., 1-100 µm). Unfortunately, this results in the output beam $OB\upsilon_1$ having been subject to a MHz frequency shift (e.g., frequency $\upsilon_1$) which cannot be detected with the type of low noise detectors typically used in many present alignment sensor arrangements. High frequencies require high detection bandwidth, resulting in more noise.

Figure 6:
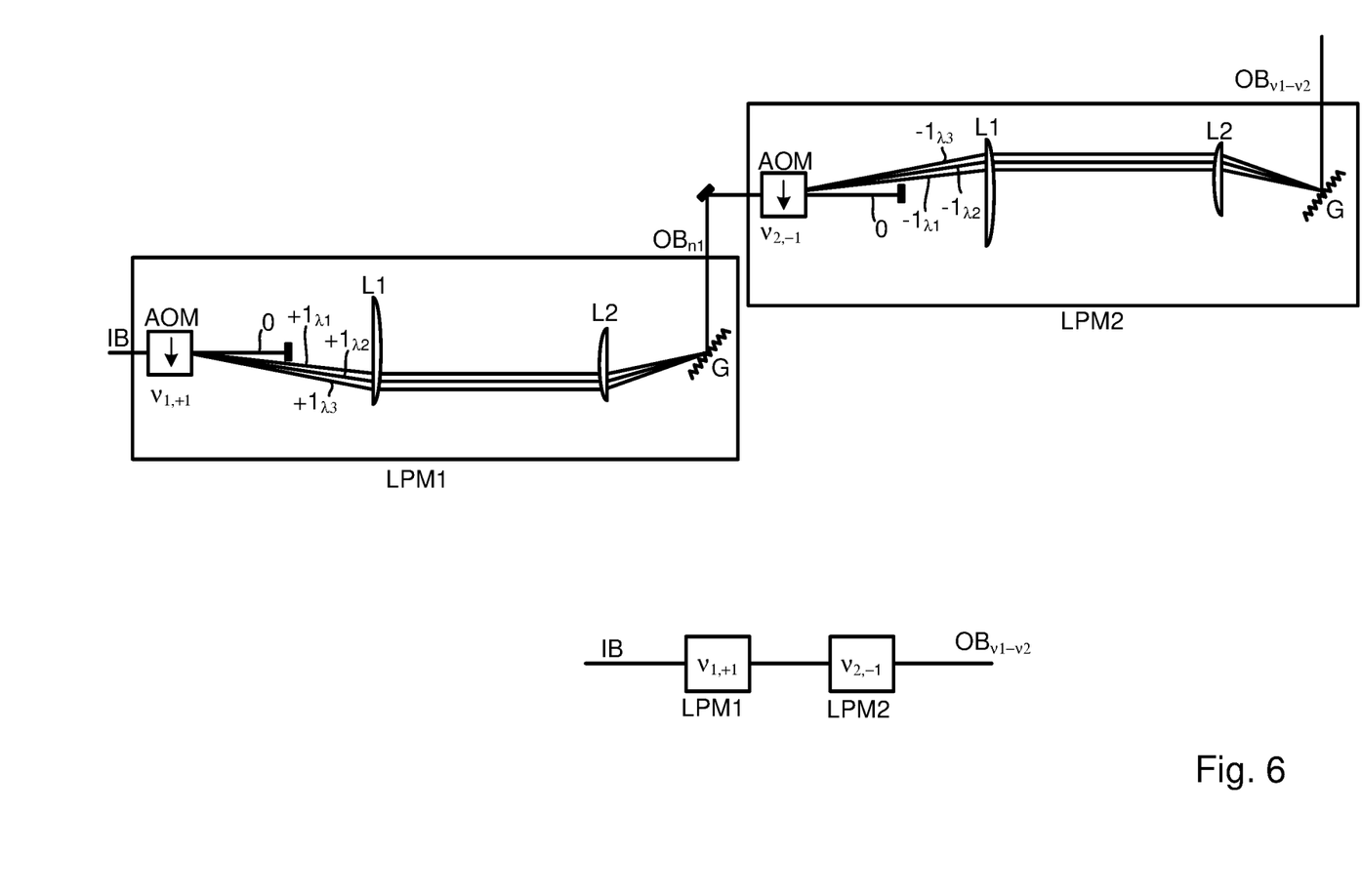
FIG. 6 is a schematic illustration of a linear phase modulator according to a second embodiment of the invention.

FIG. 6 illustrates a further embodiment which overcomes this problem and can be used with low noise detectors. This embodiment comprises providing a second linear phase modulator LPM2 to optically downmix the first frequency $\upsilon_1$ (MHz range) to frequencies detectable by low noise detectors, (e.g., typically in the kHz range). The second linear phase modulator LPM2 is essentially similar to the first linear phase modulator LPM1 (i.e., linear phase modulator LPM of FIG. 5), other than the frequency imposed by the AOM and the diffraction order imposed upon (i.e., opposite sign diffraction order to that of the first). The first linear phase modulator LPM1 results in a first Doppler shift $\Delta\upsilon_1$ on the +1 diffraction order of: $1*\upsilon_1$; the second linear phase modulator LPM2 results in a second Doppler shift $\Delta\upsilon_2$ on the −1 diffraction order of: $-1*\upsilon_2$ (since the negative diffraction order is selected in this second stage). In this manner, the output beam $OB\upsilon_1-\upsilon_2$ has been Doppler shifted by $\upsilon_1-\upsilon_2$. It should be noted that it is perfectly possible to drive both AOMs (in LPM1 and LPM2) at MHz frequencies, but choose the respective MHz frequencies such that their difference frequency is in the kHz range, while also maintain this difference extremely stable. The result is an output beam where all colors are linearly phase swept, corresponding to a Doppler shift at the difference frequency.

Figure 7:
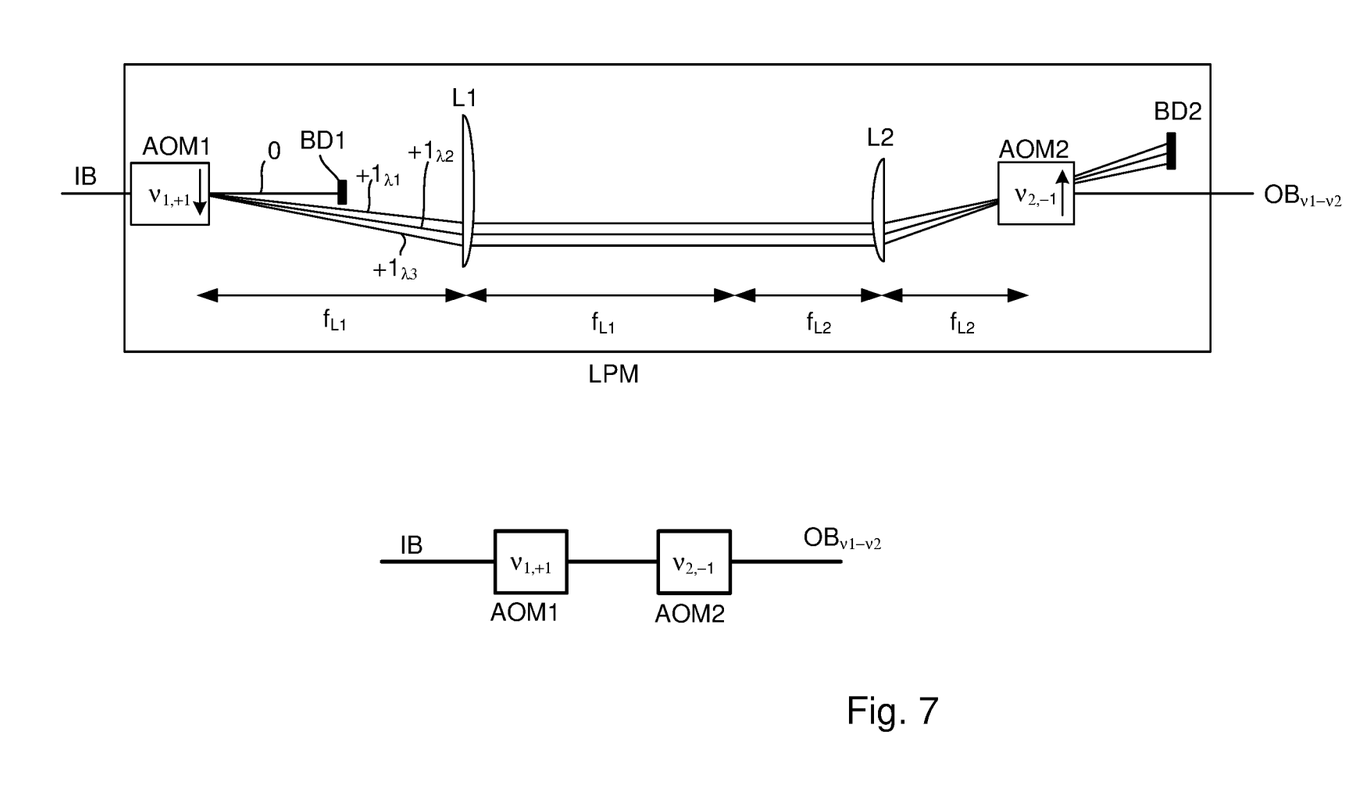
FIG. 7 is a schematic illustration of a linear phase modulator according to a third embodiment of the invention.

FIG. 7 illustrates another embodiment, which achieves essentially the same functionality as that illustrated in FIG. 6 in a simpler implementation. Instead of having a first linear phase modulator LPM1 and second linear phase modulator LPM2, each with a respective compensatory grating G, this arrangement comprises a single linear phase modulator LPM having a first AOM AOM1 and second AOM AOM2. The first AOM AOM1 operates in the same manner as that of the AOM of first linear phase modulator LPM1 in the FIG. 6 example; e.g., it imposes a first Doppler shift $\Delta\upsilon_1$ on the +1 diffraction order of: $1*\upsilon_1$. The second AOM AOM2 operates in the same manner as that of the AOM of the second linear phase modulator LPM2 in the FIG. 6 example; e.g., it imposes a second Doppler shift $\Delta\upsilon_2$ on the −1 diffraction order of: $-1*\upsilon_2$. Furthermore, the second AOM AOM2 compensates the wavelength dependent dispersion imposed by the first AOM AOM1, such that the −1 diffraction order output beam OB $\upsilon_1-\upsilon_2$ from the linear phase modulator LPM suffers little or no wavelength dispersion (the dispersed specular radiation is blocked by beam dump BD2). As can be seen by the equivalent block diagrams at the bottom of FIGS. 6 and 7, these arrangements result in the same effect on the output beam $OB\upsilon_1-\upsilon_2$.

To achieve the necessary wavelength compensation, the frequency of the second AOM AOM2 should be matched to the first AOM AOM1 taking into account any magnification imposed by the optics in between; e.g., resulting from the optical arrangement signified by lenses L1, L2. For simplicity, this optical arrangement has been illustrated as a 4f scheme (two lenses L1, L2 having focal lengths $f_{L1}$, $f_{L2}$ respectively); of course, this is purely exemplary and there are many alternative arrangements possible to refocus a beam using lenses, mirrors and/or other optical elements, etc. which could be used instead. More generally, the matched magnification of the optics between AOM1 and AOM2 allows operation of the AOMs at different frequencies.

Of course, in each of the examples of FIGS. 6 and 7, the orders at each stage may be reversed such that the −1 order from the first AOM and the +1 order from the second AOM is taken. Note that in all the examples above, orders of opposite sign may be distinguished from each other according to the direction of propagation of the phase front with respect to the source. The direction of the phase front propagation for each diffraction order direction will be dependent on the direction of travel of the moving (e.g., acoustic) grating and details of the re-imaging system (e.g., as represented by lenses L1, L2). Here, a positive order +1 order is defined as a diffraction order for which the phase front moves away from the source (away from the AOM) and the −1 order is defined as a diffraction order for which the phase front moves towards from the source (towards the AOM). As such, the arrangements of FIGS. 6 and 7 should be such that diffraction orders having opposite propagating diffraction orders at each respective stage (e.g., imposed at each respective moving grating/AOM), with respect to the source. For the specific examples given, this means that the two acoustic gratings of the arrangement of FIG. 6 move in the same direction. By contrast, in FIG. 7, due to the angle of incidence of the refocused beam onto the second AOM AOM2, the two acoustic gratings move in opposite directions. This is indicated by the arrows on each AOM in the Figures.

Figure 8:
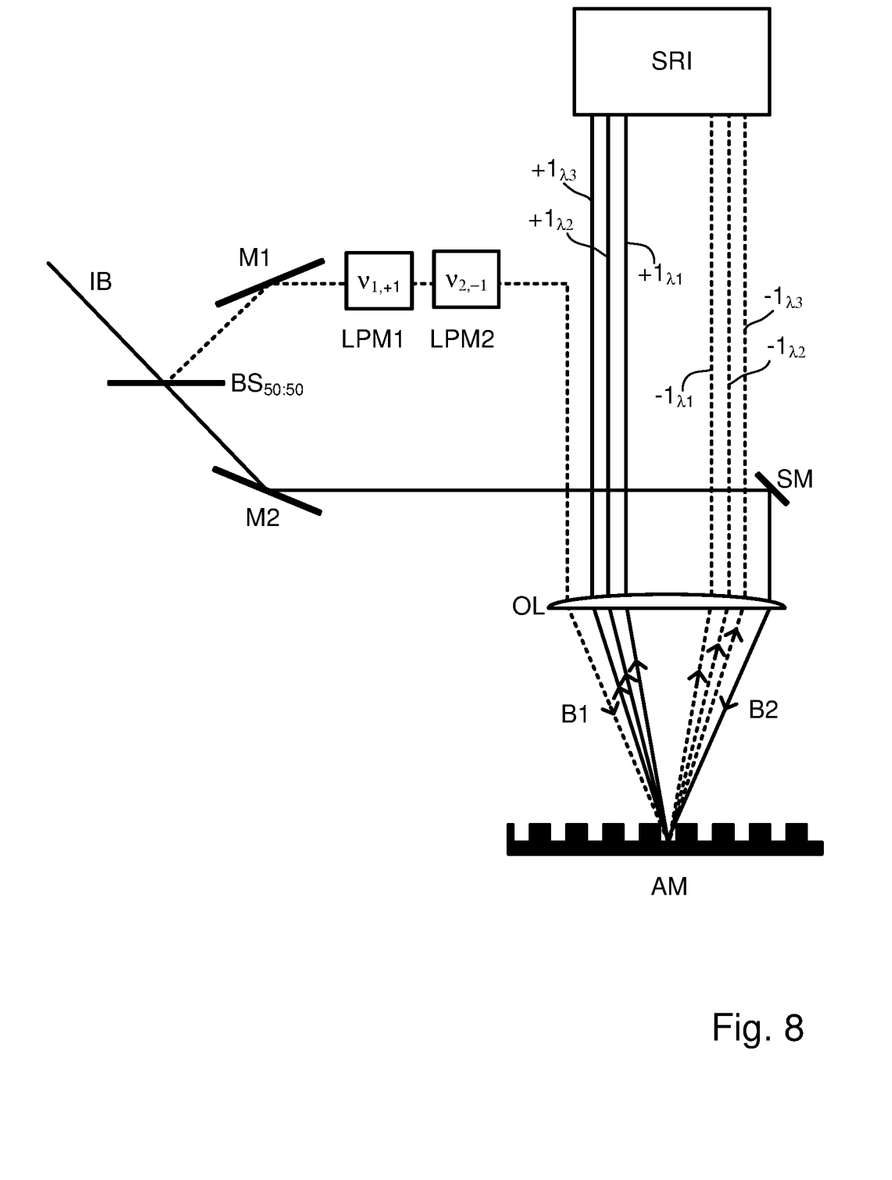
FIG. 8 is an off-axis alignment apparatus comprising a linear phase modulator according to an embodiment of the invention.

By way of a first example, FIG. 8 shows an exemplary diffraction-based alignment sensor arrangement which utilizes the linear phase modulation arrangement of FIG. 6/7 (or of FIG. 5 or else within the scope of the disclosure). FIG. 8 shows an off-axis alignment sensor arrangement whereby the measurement beams B1, B2 are at a non-normal incidence angle on the alignment mark AM. A source arrangement equally splits the input beam IB using beam splitter $BS_{50:50}$ into beams B1, B2. Beam B1 is directed to be incident onto the alignment mark AM (e.g., via mirror M1 and objective lens OL) in a first direction and beam B2 is directed to be incident onto the alignment mark AM (e.g., via mirror M2, spot mirror SM and objective lens OL) in a second direction. One of the paths of beams B1, B2 comprises the linear phase modulation arrangement LPM1, LPM2: the arrangement show this to be located to act on beam B1, although it could be located to act on beam B2. The diffracted radiation $+1_{\lambda 1}, +1_{\lambda 2}, +1_{\lambda 3}$, $-1_{\lambda 1}, -1_{\lambda 2}, -1_{\lambda 3}$ propagates to a self-referencing interferometer SRI where it is interfered to obtain an alignment position (the SRI will not be described in detail and remaining alignment sensor details are not shown as these aspects are well understood and can be found in many of the published documents already referenced herein (e.g., U.S. Pat. No. 6,628,406).

The linear phase modulation arrangement LPM1, LPM2 is operable to introduce a phase shift φ between the positive diffraction order $+1_{\lambda1},+1_{\lambda2},+1_{\lambda3}$ originating from beam B2 and the negative diffraction order $-1_{\lambda1},-1_{\lambda2},-1_{\lambda3}$ originating from beam B1 and change the measured light intensity at the detector to:

$$I_{SUM} = 1 + \cos\left(\frac{4\pi x_0}{\Lambda} + \varphi\right) \quad (7a)$$

$$I_{DIFF} = 1 - \cos\left(\frac{4\pi x_0}{\Lambda} + \varphi\right) \quad (7b)$$

where $\Lambda$ is the pitch of the acoustic grating.

Such an arrangement may be implemented in various diffraction-based alignment sensors, other than the off-axis alignment sensor shown. The arrangement is particularly suitable for arrangements where the phase is controlled in the illumination optics. However, the linear phase modulation arrangement LPM1, LPM2 could be implemented elsewhere in the system to impose a linearly time varying phase difference to one diffraction order of a complementary pair of diffraction orders e.g., directly on one of the positive diffraction order $+1_{\lambda1},+1_{\lambda2},+1_{\lambda3}$ or negative diffraction order $-1_{\lambda1},-1_{\lambda2},-1_{\lambda3}$; (e.g., for all wavelengths of that order).

It should also be noted that the phase modulation techniques and apparatuses may be applied to other interferometric techniques, such as heterodyne schemes (which can be used for alignment or overlay metrology for example). An example of using a heterodyne scheme for alignment is described in, for example, WO2017/125352 which is incorporated herein by reference.

Figure 9:
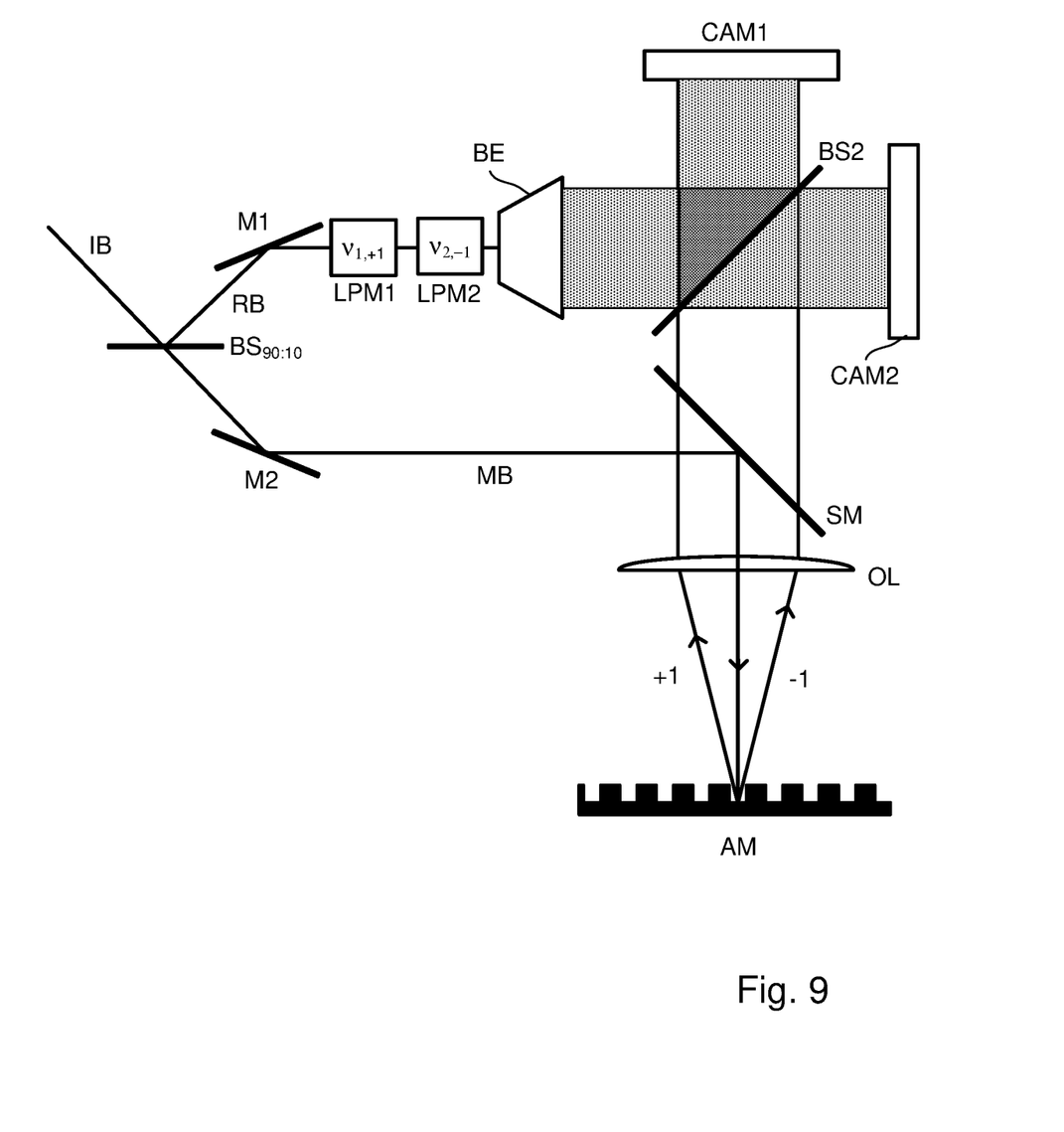
FIG. 9 is a heterodyne alignment apparatus comprising a linear phase modulator according to an embodiment of the invention.

FIG. 9 shows an exemplary heterodyne alignment sensor arrangement which applies balanced heterodyne detection in an alignment arrangement. A radiation source provides input beam IB, from which a portion of radiation (e.g 10%) is taken by beam splitter $BS_{90:10}$ to provide a reference beam RB, the remaining radiation comprising the measurement beam MB. The linear phase modulator LPM1, LPM2 of FIG. 6/7 (or of FIG. 5 or else within the scope of the disclosure) applies a phase modulation to the reference beam RB, relative to the measurement beam MB. The diffracted radiation +1, −1 from the alignment mark AM, comprising the position signal, is not imaged on a single camera, but is mixed with the reference RB (expanded by beam expander BE) in a beam splitter BS2.

Because of the applied relative phase modulation, interference between the reference beam RB and the diffracted radiation +1, −1 results in a pair of optical position signals, which are imaged on respective detectors CAM1, CAM2. Each of these optical position signals carries a time varying component corresponding to time variations in the phase applied by phase modulator LPM1, LPM2. The time varying components in the two optical position signals are exactly in anti-phase with one another. By subtracting the signals from the two detectors, the time varying component becomes apparent. Alternatively the alignment information may be extracted from only one of the signals (e.g., the signal imaged on detector CAM2 with the signal on detector CAM1 ignored). The image on detector CAM2 will comprise oscillating traces, albeit now having a strong DC component, from which the alignment position can be determined. Using synchronous detection based on knowledge of the applied phase modulation, the optical position signals can be used to obtain an electronic position signal with improved signal to noise ratio.

It should be noted that while the above description has described the linear phase modulation arrangement LPM1, LPM2 in terms of its use for alignment or positional sensors, it may also find use in other metrology sensors such as scatterometry based sensors for measuring overlay or focus.

It should be noted that while the above description has been described in terms of using an AOM to obtain the moving grating (i.e., a moving acoustic grating) the concepts described herein are not so limited. Any arrangement to obtain a moving grating which can impose a wavelength independent linearly time varying phase shift on the diffracted radiation can be used. Such arrangements therefore encompass provided moving physical gratings (e.g., moved via actuators etc.) and it should be understood that any mention of AOM above can be understood to read moving grating generally.

The phase modulation techniques can be used in all interferometric techniques including heterodyne detection, and enables scan-free diffraction based alignment (or other metrology), i.e., alignment without moving or scanning the spot over the target. Also, there are advantages in the fact that such methods yield phase information in addition to amplitude information. This enables balanced heterodyne detection for diffraction based alignment.

The embodiments may further be described using the following clauses:

1. A phase modulator apparatus for modulating input radiation; comprising:
   at least a first phase modulator comprising:
   a first moving grating in at least an operational state for diffracting the input radiation and Doppler shifting the frequency of the diffracted radiation; and
   a first compensatory grating element comprising a pitch configured to compensate for wavelength dependent dispersion of at least one diffraction order of said diffracted radiation.
2. A phase modulator apparatus of clause 1, comprising a first acousto-optical modulator being operable to provide the first moving grating, the first moving grating being a first moving acoustic grating.
3. A phase modulator apparatus of clause 2, wherein the first acousto-optical modulator comprises an acousto-optical tunable filter.
4. A phase modulator apparatus of clause 1, 2 or 3 wherein the first phase modulator comprises a first optical arrangement to refocus the at least one diffraction order onto the first compensatory grating element.
5. A phase modulator apparatus of any preceding clause, wherein the grating pitch of the first compensatory grating element is matched to the pitch of the first moving grating, said matching compensating for any intervening magnification imposed between the first moving grating and first compensatory grating element.
6. A phase modulator apparatus of any preceding clause, wherein said input radiation comprises a plurality of wavelengths.
7. A phase modulator apparatus of any preceding clause, comprising a second moving grating in at least an operational state operable to diffract the radiation output from the first moving grating and Doppler shift the frequency of this diffracted radiation so as to downshift the frequency of radiation output from the first moving grating.
8. A phase modulator apparatus of clause 7, wherein said at least one diffraction order diffracted by the first moving grating and at least one diffraction order diffracted by said second moving grating comprise diffraction orders of opposite sign such that an output frequency of radiation output from the phase modulator apparatus comprises a difference of first frequency used to generate the first moving grating or movement thereof and second frequency used to generate the second moving grating or movement thereof.

9. A phase modulator apparatus of clause 8, comprising a second acousto-optical modulator being operable to provide the second moving grating, the second moving grating being a second moving acoustic grating.

10. A phase modulator apparatus of clause 9, wherein the difference of a first frequency used to generate the first moving grating and second frequency used to generate the second moving grating is less than 1 MHz.

11. A phase modulator apparatus of clause 10, wherein said diffraction orders of opposite sign comprise a +1 diffraction order and a −1 diffraction order.

12. A phase modulator apparatus of clause 9, 10 or 11, wherein a second frequency used to generate the second moving grating is such that the grating pitch of the second moving grating is matched to that of the first moving grating, said matching compensating for any intervening magnification imposed between the first moving grating and second moving grating, such that said first compensatory grating element comprises said second moving grating.

13. A phase modulator apparatus of any of clauses 9 to 11, comprising a second phase modulator, the second phase modulator comprising:
the second acousto-optical modulator;
a second compensatory grating element; and
a second optical arrangement to refocus at least one diffraction order of the radiation diffracted from the second moving grating onto the second compensatory grating element;
wherein the second compensatory grating element comprises a pitch configured to compensate for wavelength dependent dispersion of said at least one diffraction order diffracted by said second moving grating.

14. A phase modulator apparatus of clause 13, wherein the grating pitch of the second compensatory grating element is matched to that of the second moving grating, said matching compensating for any intervening magnification imposed between the second moving grating and second compensatory grating element.

15. A phase modulator apparatus of any preceding clause, wherein the Doppler shifting is operable to impose a wavelength independent linearly time varying phase shift on each diffraction order.

16. A metrology device comprising a phase modulator apparatus of any preceding clause.

17. A metrology device of clause 16, wherein the phase modulator apparatus is operable to induce a linearly time varying phase difference to one signal carrying diffraction order of a complementary pair of signal carrying diffraction orders resulting from measurement of a structure with respect to the other signal carrying diffraction order of the complementary pair of signal carrying diffraction orders.

18. A metrology device of clause 16 or 17, wherein the metrology device is an off-axis metrology device and the phase modulator apparatus is operable to impose a linearly time varying phase shift on only one measurement beam of a pair of off-axis measurement beams.

19. A metrology device of clause 16, wherein the metrology device is a heterodyne metrology device wherein the phase modulator apparatus is operable to impose a linearly time varying phase shift on a reference beam generated by the metrology device.

20. A metrology device of any of clauses 16 to 19, wherein the phase modulator apparatus is located in an illumination arrangement of the metrology device.

21. A metrology device of any of clauses 16 to 20, wherein the metrology device comprises an alignment sensor.

22. A metrology device of clause 21, being operable to generate a modulated alignment signal from measurement of an alignment mark as a result of said linearly time varying phase shift, and without moving the measurement beam with respect to the alignment mark.

23. A metrology device of clause 21 or 22, being operable to measure an alignment mark smaller than 6 µm in either dimension of the substrate plane using a static measurement beam with respect to the alignment mark.

24. A lithographic apparatus comprising the alignment sensor of any of clauses 21, 22 or 23.

25. A lithographic apparatus of clause 24, further comprising:
a substrate stage for holding the substrate;
a reticle stage for holding a patterning device; and
a projection lens for projecting a pattern on said patterning device onto said substrate;
wherein the alignment sensor is operable to measure a position of one or both of the substrate stage and the reticle stage.

26. A metrology device of any of clauses 16 to 20, wherein the metrology device comprises a scatterometry based metrology apparatus.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A phase modulator apparatus for modulating input radiation, comprising:
    at least a first phase modulator comprising:
        a first moving grating configured to move in at least an operational state to diffract the input radiation and Doppler shift a frequency of the diffracted radiation; and
        a first compensatory grating element comprising a pitch configured to compensate for wavelength dependent dispersion of at least one diffraction order of the diffracted radiation.

2. The phase modulator apparatus of claim 1, further comprising a first acousto-optical modulator, and wherein the first moving grating comprises a first moving acoustic grating.

3. The phase modulator apparatus of claim 2, wherein the first acousto-optical modulator comprises an acousto-optical tunable filter.

4. The phase modulator apparatus of claim 1, wherein the first phase modulator comprises a first optical arrangement to refocus the at least one diffraction order onto the first compensatory grating element.

5. The phase modulator apparatus of claim 1, wherein the pitch of the first compensatory grating element is matched to a pitch of the first moving grating, the matching thereby compensating for any intervening magnification imposed between the first moving grating and the first compensatory grating element.

6. The phase modulator apparatus of claim 1, wherein the input radiation comprises a plurality of wavelengths.

7. The phase modulator apparatus of claim 1, comprising a second moving grating in at least an operational state operable to diffract the radiation output from the first moving grating and Doppler shift the frequency of this diffracted radiation so as to down-shift the frequency of radiation output from the first moving grating.

8. The phase modulator apparatus of claim 7, wherein at least one diffraction order diffracted by the first moving grating and at least one diffraction order diffracted by the second moving grating, comprise diffraction orders of opposite sign such that an output frequency of radiation output from the phase modulator apparatus comprises a difference of a first frequency used to generate the first moving grating or movement thereof and second frequency used to generate the second moving grating or movement thereof.

9. The phase modulator apparatus of claim 8, comprising a second acousto-optical modulator operably associated with the second moving grating, the second moving grating comprising a second acoustic grating.

10. The phase modulator apparatus of claim 9, wherein the difference of the first frequency used to generate the first moving grating and the second frequency used to generate the second moving grating, is less than 1 MHz.

11. The phase modulator apparatus of claim 10, wherein the diffraction orders of opposite sign comprise a +1 diffraction order and a −1 diffraction order.

12. The phase modulator apparatus of claim 9, wherein a second frequency is used to generate the second moving grating such that the grating pitch of the second moving grating is matched to that of the first moving grating, the matching compensating for any intervening magnification imposed between the first moving grating and second moving grating, such that the first compensatory grating element comprises the second moving grating.

13. The phase modulator apparatus of claim 9, comprising a second phase modulator, the second phase modulator comprising:
    the second acousto-optical modulator;
    a second compensatory grating element; and
    a second optical arrangement to refocus at least one diffraction order of the radiation diffracted from the second moving grating onto the second compensatory grating element,
    wherein the second compensatory grating element comprises a pitch configured to compensate for wavelength dependent dispersion of the at least one diffraction order diffracted by the second moving grating.

14. The phase modulator apparatus of claim 13, wherein a grating pitch of the second compensatory grating element is matched to that of the second moving grating, the matching compensating for any intervening magnification imposed between the second moving grating and the second compensatory grating element.

15. The phase modulator apparatus of claim 1, wherein the Doppler shifting is operable to impose a wavelength independent linearly time varying phase shift on each diffraction order.

* * * * *

UNITED STATES PATENT AND TRADEMARK OFFICE
CERTIFICATE OF CORRECTION

PATENT NO. : 11,815,675 B2
APPLICATION NO. : 17/633882
DATED : November 14, 2023
INVENTOR(S) : Den Boef et al.

It is certified that error appears in the above-identified patent and that said Letters Patent is hereby corrected as shown below:

In the Specification

In Column 8, Line 3, delete ""A"" and insert -- "Λ" --, therefor.

In the Claims

In Column 18, Claim 8, Line 1, after "and" insert -- a --.

Signed and Sealed this
Ninth Day of January, 2024

Katherine Kelly Vidal
*Director of the United States Patent and Trademark Office*